US006689534B2

(12) United States Patent
Oda et al.

(10) Patent No.: US 6,689,534 B2
(45) Date of Patent: Feb. 10, 2004

(54) PLANOGRAPHIC PRINTING ORIGINAL PLATE

(75) Inventors: Akio Oda, Shizuoka-ken (JP); Ippei Nakamura, Shizuoka-ken (JP); Tomotaka Tsuchimura, Shizuoka-ken (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 97 days.

(21) Appl. No.: 09/925,444

(22) Filed: Aug. 10, 2001

(65) Prior Publication Data

US 2002/0119392 A1 Aug. 29, 2002

(30) Foreign Application Priority Data

Aug. 11, 2000 (JP) ....................................... 2000-244159

(51) Int. Cl.[7] ................................................ G03F 7/004

(52) U.S. Cl. ................................ 430/270.1; 430/281.1; 430/283.1; 430/302; 430/303

(58) Field of Search ........................... 430/270.1, 281.1, 430/283.1, 302, 303

(56) References Cited

U.S. PATENT DOCUMENTS

| | | | | | |
|---|---|---|---|---|---|
| 4,424,325 | A | * | 1/1984 | Tsunoda et al. | 526/245 |
| 4,724,195 | A | * | 2/1988 | Muller et al. | 430/192 |
| 5,006,443 | A | * | 4/1991 | Muller | 430/192 |
| 5,245,430 | A | * | 9/1993 | Nishimura | 348/497 |
| 5,840,467 | A | * | 11/1998 | Kitatani et al. | 430/302 |
| 5,981,145 | A | * | 11/1999 | Ding et al. | 430/271.1 |
| 6,114,083 | A | * | 9/2000 | Kawamura et al. | 430/270.1 |
| 6,117,613 | A | * | 9/2000 | Kawauchi et al. | 430/270.1 |
| 6,174,646 | B1 | * | 1/2001 | Hirai et al. | 430/302 |
| 6,387,588 | B1 | * | 5/2002 | Katano et al. | 430/270.1 |
| 6,416,932 | B1 | * | 7/2002 | Ray et al. | 430/303 |
| 6,423,467 | B1 | * | 7/2002 | Kawauchi et al. | 430/270.1 |
| 6,472,129 | B2 | * | 10/2002 | Noguchi et al. | 430/326 |
| 2002/0048722 | A1 | * | 4/2002 | Aoshima | 430/270.1 |

FOREIGN PATENT DOCUMENTS

| | | | |
|---|---|---|---|
| EP | 0 843 218 A1 | | 5/1998 |
| EP | 0 909 657 A2 | | 4/1999 |
| EP | 911153 | * | 4/1999 |
| EP | 940266 | * | 9/1999 |
| EP | 0 949 539 A2 | | 10/1999 |
| EP | 0 950 517 A1 | | 10/1999 |
| JP | 11-288093 | | 10/1999 |

* cited by examiner

*Primary Examiner*—Janet Baxter
*Assistant Examiner*—Amanda C. Walke
(74) *Attorney, Agent, or Firm*—Burns, Doane, Swecker & Mathis, LLP

(57) ABSTRACT

A positive-type planographic printing original plate for direct plate-making with an infrared laser, with excellent latitude in forming an image by development, and excellent flaw resistance. The planographic printing original plate includes, on a support, a positive-type recording layer whose solubility with respect to an alkaline aqueous solution is increased by infrared laser exposure. The recording layer contains an alkali-soluble resin, which has a fluorine atom in the molecule, and an infrared absorbing agent. The alkali-soluble resin can be provided by introducing at least one substituent having a fluorine atom to a known alkali-soluble polymer compound.

14 Claims, No Drawings

PLANOGRAPHIC PRINTING ORIGINAL PLATE

BACKGROUND OF THE INVENTION

1. Field of the Invention

The present invention relates to an image recording material to be used as an offset printing master. In particular, the present invention relates to a positive-type planographic printing original plate for an infrared laser for so-called direct plate-making, to be produced directly from digital signals of a computer or the like.

2. Description of the Related Art

Recently, development of lasers has been remarkable. In particular, solid lasers and semiconductor lasers having a near-infrared to infrared light emission area can be obtained with a high output and a small size. These lasers are extremely useful as an exposure light source at the time of producing a plate directly from digital data of a computer, or the like.

A positive-type planographic printing plate material for an infrared laser includes an alkaline aqueous solution-soluble binder resin and an IR dye that absorbs light and generates heat or the like as essential components. The IR dye or the like functions as a dissolution inhibiting agent for substantially lowering the solubility of the binder resin by interaction with a binder resin in an unexposed part (image part). In an exposed part (non-image part), the interaction between the IR dye or the like and the binder resin is weakened by the generated heat such that the binder resin is dissolved in an alkaline developing solution so as to provide a planographic printing plate.

However, such a positive-type planographic printing plate material for an infrared laser involves a problem in that the difference between dissolution resistance of the unexposed part (image part) with respect to a developing solution and the solubility of the exposed part (non-image part) is not sufficient in various use conditions, and thus excessive development and developing failures can easily be generated due to fluctuations of use conditions. Moreover, in a case where the surface state is changed slightly due to contact on the surface in handling or the like, a problem arises in that the unexposed part (image part) is dissolved at the time of development, forming flaws and causing printing durability deterioration and poor adherence.

These problems are derived from the inherent difference between a positive-type planographic printing plate material for an infrared laser and a positive-type planographic printing plate material produced by UV exposure. That is, the positive-type planographic printing plate material produced by the UV exposure includes an alkaline aqueous solution-soluble binder resin, an onium salt, and a quinonediazide compound as essential components. The onium salt and the quinonediazide compound perform two roles, not only as a dissolution inhibiting agent in the unexposed part (image part), by interaction with the binder resin, but also as a dissolution promoting agent in the exposed part (non-image part), by decomposition by light so as to generate an acid.

In contrast, the IR dye or the like in the positive-type planographic printing plate material for an infrared laser functions only as a dissolution inhibiting agent for the unexposed part (image part), without a function of promoting the dissolution of the exposed part (non-image part). Therefore, in the positive-type planographic printing plate material for an infrared laser, in order to provide solubility difference between the unexposed part and the exposed part, as the binder resin, a resin having high solubility with respect to an alkaline developing solution must be used, and thus a state before development is unstable.

In order to improve the dissolution resistance of the unexposed part (image part) with respect to the developing solution, without lowering the developing property of the exposed part (non-image part), for example, Japanese Patent Application Laid Open (JP-A) No. 11-288093 discloses a method of using a copolymer including a fluorine-containing monomer capable of addition polymerization with a fluoro aliphatic group with a hydrogen atom on a carbon atom substituted by a fluorine atom at a side chain. Moreover, EP950517 discloses a method of using a siloxane based surfactant. Although these methods to some extent contribute to improvement of the developing resistance of the recording layer image part, the solubility difference between the unexposed part and the exposed part cannot be provided sufficiently for forming a sharp and good image regardless of developing solution activity fluctuations.

SUMMARY OF THE INVENTION

Accordingly, an object of the present invention is to provide a positive-type planographic printing original plate for an infrared laser which has a recording layer with excellent latitude in forming an image by development, and excellent flaw resistance.

As a result of detailed studies by the present inventors, it was found that a planographic printing plate having excellent developing latitude and excellent flaw resistance can be obtained by using a positive-type photosensitive composition for an infrared laser that includes a fluorine-containing alkali-soluble resin as a recording layer. Thus, the present invention has been completed.

That is, a planographic printing original plate according to the present invention includes: a support; and on the support, a positive-type recording layer comprising an infrared absorbing agent and a water-insoluble, alkali-soluble resin which has a fluorine atom in a molecule thereof, solubility in an alkaline aqueous solution of the recording layer being increasable by infrared laser exposure.

As a water-insoluble, alkali-soluble resin having a fluorine atom in the molecule to be used herein, a polymer compound having a phenol hydroxyl group or a novolak compound is preferable.

In the present invention, the reason why the developing latitude and flaw resistance of an obtained positive-type planographic printing original plate can be made excellent by use of the above-mentioned fluorine-containing alkali-soluble resin is not clear. However, it is thought that a functional group having a fluorine atom in a molecule of the above-mentioned alkali-soluble resin forms an outermost part by being oriented and being present locally on the recording layer surface during a drying step in applying and drying a recording layer coating liquid containing the alkali-soluble resin molecules so that resistance with respect to the developing solution and external stresses is improved in an image part, and further, since the fluorine atom-containing functional group does not inhibit the stability or solubility inherent to the alkali-soluble resin in a non-image part, a recording layer with excellent developing latitude can be formed.

DESCRIPTION OF THE PREFERRED EMBODIMENTS

Hereinafter, the present invention will be explained in detail.

According to a planographic printing original plate according to the present invention, an alkali-soluble resin having a fluorine atom in a molecule and a infrared absorbing agent should be contained in a recording layer. Hereafter, components comprising the recording layer will be explained successively.

Water-insoluble, Alkali-soluble Resin Having a Fluorine Atom in the Molecule

As a water-insoluble, alkali-soluble resin having a fluorine atom in the molecule (hereinafter optionally referred to as a fluorine-containing alkali-soluble resin) to be used in the present invention, any of conventionally known water-insoluble, alkaline aqueous solution-soluble polymer compounds with at least one kind of substituent having a fluorine atom introduced therein can be used.

As a water-insoluble, alkaline aqueous soluble polymer compound (hereinafter optionally referred to as an alkali-soluble polymer) to serve as a base, a polymer compound having in the molecule any functional group selected from (1) a phenol hydroxyl group, (2) a sulfonamide group, and (3) an active imide group is preferable. Although a polymer compound having (1) the phenol hydroxyl group in the molecule is particularly preferable, the present invention is not limited thereto.

As a fluorine-containing alkali-soluble resin, specifically, copolymers of a polymerizable monomer (hereinafter referred to as a "specific monomer unit") containing a low molecular compound having, in the molecule, at least one each of a substituent having a fluorine atom and a polymerizable unsaturated bond, and at least one selected from (1) a polymerizable monomer having a phenol hydroxyl group, (2) a polymerizable monomer having a sulfonamide group, and (3) a polymerizable monomer having an active imide group, and copolymers of these monomers and other polymerizable monomers, can be presented.

Furthermore, as a fluorine-containing alkali-soluble resin having a phenol hydroxyl group as the alkali-soluble group, a resin obtained by condensation of a phenol compound and an aldehyde such as formaldehyde, such as a novolak resin, can be presented. In this case, either or both of the phenol compound and the aldehyde to be condensed has a substituent having a fluorine atom.

Moreover, as a fluorine-containing alkali-soluble resin according to the present invention, those having the below-mentioned specific monomer units as a component unit can be used. In order to obtain such a fluorine-containing alkali-soluble resin, synthesis can be carried out using the below-mentioned specific monomer units as a starting substance. It is also possible to adopt a method of using a monomer excluding a substituent having a fluorine atom from the below-mentioned specific monomer units, and introducing a substituent having a fluorine atom by a polymer reaction after a single polymerization or a copolymerization, so as to consequently obtain a specific alkaline water-soluble polymer having the below-mentioned specific monomer units as a component unit.

As a polymer reaction for introducing a substituent having a fluorine atom, a method of electrophilic or nucleophilic substitution on an aromatic ring in an alkali-soluble polymer, and a method of modifying a substituent such as a hydroxyl group or an amino group in an alkali-soluble polymer by an ester bond, an ether bond, a urethane bond, an amide bond, or the like, can be presented.

As a substituent containing a fluorine atom to be introduced into a fluorine-containing alkali-soluble resin according to the present invention, a substituent having surface orientation, such that the fluorine-containing alkali-soluble resin is shifted to the vicinity of the surface so as to exist locally at a time of forming an image-forming layer by applying and drying an image-forming layer coating liquid, is preferable.

As preferable examples of such a substituent containing a fluorine atom, the following can be presented.

(a) a fluorine atom (b) a trifluoromethyl group, a pentafluoroethyl group, or a heptafluoropropyl group (c) a perfluoroalkyl group represented by $—(CF_2)_nCF_3$, $—CF_2(CF_2)_mH$ (wherein n denotes an integer from 3 to 20, and m denotes an integer from 0 to 19)

(d) a fluorine-substituted aryl group such as a pentafluorophenyl group or a tetrafluorophenyl group (e) a perfluoroalkenyl group, such as $—C(CF_2CF_3){=}C(CF_3)_2$, $—C(CF_3){=}C[[CF(CF_3)_2]$, $—C[CF(CF_3)_2]{=}C(CF_3)CF_2CF_2CF_3$, $C(CF_3){=}C(CF_3)C(CF_3)(CF_2CF_3)_2$, or the like.

Examples of the specific monomer units having a fluorine atom will be provided below with the general structures thereof and the functional groups to be introduced, but the present invention is not limited thereto.

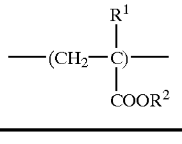

| | | | |
|---|---|---|---|
| $R^1$ = | $—H$ | $R^1$ = | $—CH_3$ |
| $R^2$ = | $—CH_2CF_2CF_3$ | $R^2$ = | $—CH_2CF_2CF_3$ |
| | $—CH_2CH_2(CF_2)_7CF_3$ | | $—CH_2CH_2(CF_2)_7CF_3$ |
| | $—CH_2CH_2(CF_2)_9CF_3$ | | $—CH_2CH_2(CF_2)_9CF_3$ |
| | $—CH_2CH_2(CF_2)_3CF_3$ | | $—CH_2CH_2(CF_2)_3CF_3$ |
| | $—CH_2(CF_2)_6CF_3$ | | $—CH_2(CF_2)_6CF_3$ |
| | $—CH_2CH_2(CF_2)_5CF_3$ | | $—CH_2CH_2(CF_2)_5CF_3$ |

-continued
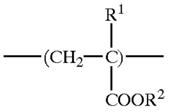
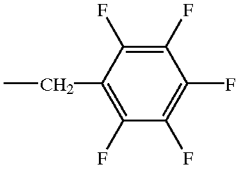
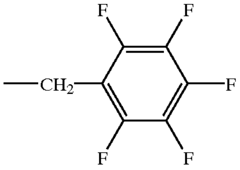
$—CH_2(CF_2)_6H$
$—CH_2(CF_2)_6H$
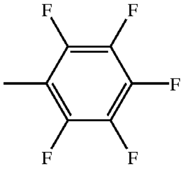
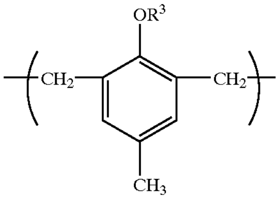
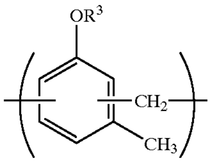
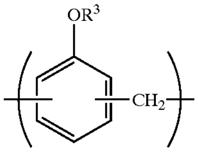
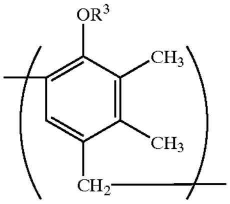
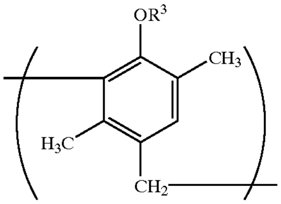
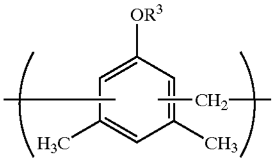
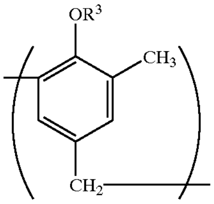
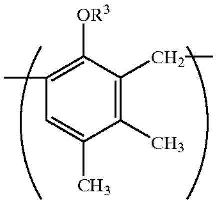
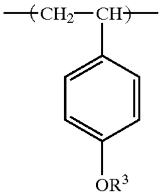
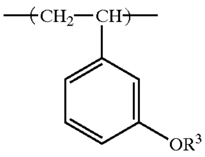
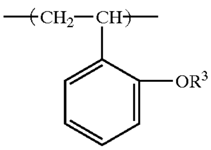

-continued

| 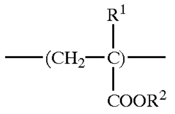 | | | |
|---|---|---|---|
| $R^3$ = | $—R^4$ | $R^4$ = | $—CF_3$ |
| | 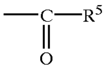 | | $—CF_2CF_3$ |
| | | | $—CF_2CF_2H$ |
| | 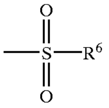 | | $—CH_2CH_2(CF_2)_3CF_3$ |
| | | | $—CH_2CH_2(CF_2)_7CF_3$ |
| | 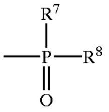 | | 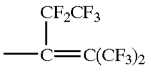 |
| | | | 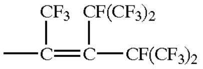 |
| | | | 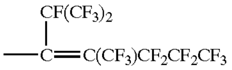 |
| | | | 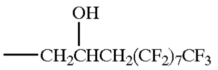 |
| | | | 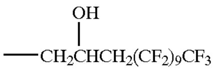 |
| $R^5$ = | $—CF_2CF_3$ | $R^7$ = | $—OCH_2(CF_2)_2CF_3$ |
| | $—(CF_2)_6H$ | | $—OCH_2(CF_2)_8H$ |
| | $—(CF_2)_8H$ | | $—OCH_2(CF_2)_6H$ |
| | $—(CF_2)_6CF_3$ | | $—OCH_2(CF_2)_{10}H$ |
| | $—(CF_2)_2CF_3$ | | $—OCH_2(CF_2)_3CF_3$ |
| | $—(CF_2)_2H$ | | $—(CF_2)_3CF_3$ |
| | $—(CF_2)_4H$ | | $—CH_3$ |
| $R^6$ = | $—(CF_2)_3CF_3$ | | $—C_6H_5$ |
| | $—(CF_2)_7CF_3$ | | $—OC_6H_5$ |
| | $—(CF_2)_2O(CF_2)_9CF_3$ | | |
| | $—(CF_2)_2O(CF_2)_3CF_3$ | | |
| | $—(CF_2)_2CF_3$ | | |

$R^8$ represents the same group of selectable substituents as $R^7$, and at least one of $R^7$ and $R^8$ is a substituent having a fluorine atom.

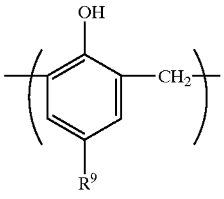 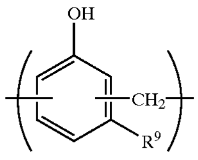 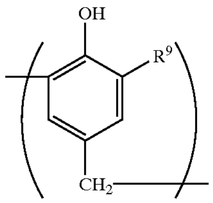

$R^9$ = $—F$
$—CF_3$
$—OCF_3$
$—OCH_2CH_2(CF_2)_7CF_3$

-continued $—OCH_2CH_2(CF_2)_9CF_3$

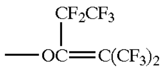

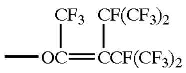

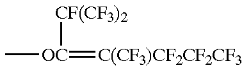

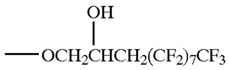

$—CH_2CH_2NHCO(CF_2)_7CF_3$
$—NHCO(CF_2)_7CF_3$
$—CH_2CH_2OCO(CF_2)_7CF_3$

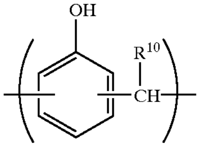 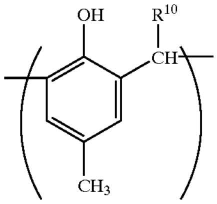 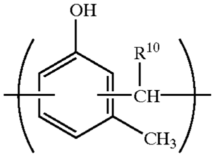

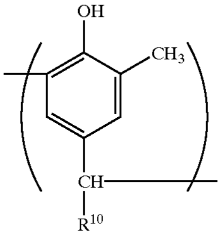 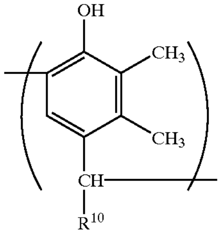 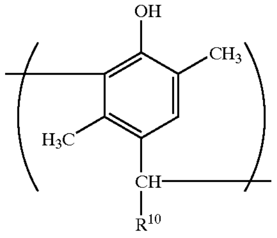

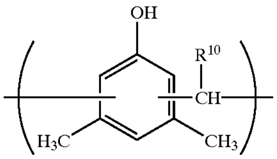 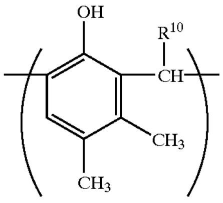 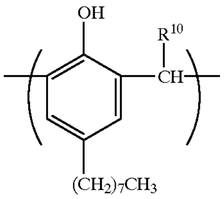

$R^{10}$ =

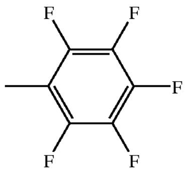 $—(CF_2)_3CF_3$

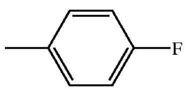 $—(CF_2)_7CF_3$

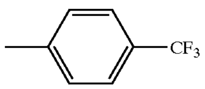 $—CH_2(CF_2)_5CF_3$

Next, representative examples of a polymer component of an alkaline water-soluble polymer compound into which the fluorine-containing unit is introduced will be described.

(1) As a polymerizable monomer having a phenol hydroxyl group, polymerizable monomers comprising a low molecular compound having one each or more unsaturated bonds polymerizable with a phenol hydroxyl group can be presented. Examples thereof include an acrylamide, methacrylamide, ester acrylate, ester methacrylate, hydroxy styrene or the like having a phenol hydroxyl group.

Specifically, for example, N-(2-hydroxy phenyl) acrylamide, N-(3-hydroxy phenyl) acrylamide, N-(4-hydroxy phenyl) acrylamide, N-(2-hydroxy phenyl) methacrylamide, N-(3-hydroxy phenyl) methacrylamide, N-(4-hydroxy phenyl) methacrylamide, o-hydroxy phenyl acrylate, m-hydroxy phenyl acrylate, p-hydroxy phenyl acrylate, o-hydroxy phenyl methacrylate, m-hydroxy phenyl methacrylate, p-hydroxy phenyl methacrylate, o-hydroxy styrene, m-hydroxy styrene, p-hydroxy styrene, 2-(2-hydroxy phenyl) ethyl acrylate, 2-(3-hydroxy phenyl) ethyl acrylate, 2-(4-hydroxy phenyl) ethyl acrylate, 2-(2-hydroxy phenyl) ethyl acrylate, 2-(2-hydroxy phenyl) ethyl methacrylate, 2-(3-hydroxy phenyl) ethyl methacrylate, 2-(4-hydroxy phenyl) ethyl methacrylate, and the like can be presented. These monomers having a phenol hydroxyl group can be used in a combination of two or more.

(2) As a polymerizable monomer having a sulfonamide group, polymerizable monomers comprising a sulfonamide group (—NH—$SO_2$—) with a nitrogen atom bonded with at least one hydrogen atom in a molecule, and a low molecular compound having one or more polymerizable unsaturated bond can be presented. For example, a low molecular compound having an acryloyl group, allyl group, or a vinyloxy group, and a substituted or mono-substituted amino sulfonyl group or a substituted sulfonyl imino group is preferable. As such a compound, for example, the compounds represented by the general formulae (I) to (V) disclosed in JP-A No. 8-123029 can be presented.

(2) As a polymerizable monomer having a sulfonamide group, specifically, m-amino sulfonyl phenyl methacrylate, N-(p-amino sulfonyl phenyl) methacrylamide, N-(p-amino sulfonyl phenyl) acrylamide, and the like can be used preferably.

(3) As a polymerizable monomer having an active imide group, those having an active imide group as disclosed in JP-A No. 11-84657 in the molecule are preferable. For example, a polymerizable monomer comprising a low molecular compound having one or more active imide groups and one or more polymerizable unsaturated bonds in a molecule can be presented.

(3) As a polymerizable monomer having an active imide group, specifically, N-(p-toluene sulfonyl) methacrylamide, N-(p-toluene sulfonyl) acrylamide, and the like can be used preferably.

As other polymerizable monomers, for example, the monomers shown in the below-mentioned items (4) to (15) can be used, but the present invention is not limited thereto.

(4) Acrylic esters and methacrylic esters having an aliphatic hydroxyl group, such as 2-hydroxy ethyl acrylate and 2-hydroxy ethyl methacrylate.

(5) Alkyl acrylates such as methyl acrylate, ethyl acrylate, propyl acrylate, butyl acrylate, amyl acrylate, hexyl acrylate, octyl acrylate, benzyl acrylate, acrylic acid-2-chloro ethyl, and glycidyl acrylate.

(6) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, acrylic acid-2-chloroethyl, and glycidyl methacrylate.

(7) Acrylamides and methacrylamides, such as amide acrylate, amide methacrylate, N-methylol acrylamide, N-ethyl acrylamide, N-hexyl methacrylic amid, N-cyclohexyl acrylamide, N-hydroxy ethyl acrylamide, N-phenyl acrylamide, N-nitro phenyl acrylamide, and N-ethyl-N-phenyl acrylamide.

(8) Vinyl ethers such as ethyl vinyl ether, 2-chloro ethyl vinyl ether, hydroxy ethyl vinyl ether, propyl vinyl ether, butyl vinyl ether, octyl vinyl ether, and phenyl vinyl ether.

(9) Vinyl esters such as vinyl acetate, vinyl chloro acetate, vinyl butylate, and vinyl benzoate.

(10) Styrenes such as styrene, α-methyl styrene, methyl styrene, and chloro methyl styrene.

(11) Vinyl ketones such as methyl vinyl ketone, ethyl vinyl ketone, propyl vinyl ketone, and phenyl vinyl ketone.

(12) Olefins such as ethylene, propylene, isobutylene, butadiene, and isoprene.

(13) N-vinyl pyrrolidone, acrylonitrile, methacrylonitrile, and the like.

(14) Unsaturated imides such as maleimide, N-acryloyl acrylamide, N-acetyl methacrylamide, N-propionyl methacrylamide, and N-(p-chloro benzoyl) methacrylamide.

(15) Unsaturated carboxylic acids such as acrylic acid, methacrylic acid, maleic anhydride, and itaconic acid.

As an alkaline water-soluble polymer compound having a fluorine atom, those having a phenol hydroxyl group, such as a polymer of a polymerizable monomer having a fluorine atom and (1) the polymerizable monomer having a phenol hydroxyl group, are preferable for the excellent image forming property by exposure by an infrared laser or the like. In addition to this polymer, those having a fluorine atom introduced into (1) the alkaline water-soluble polymer compound having a phenol hydroxyl group can also be used. As the alkaline water-soluble polymer compound having a phenol hydroxyl group, for example, novolak resins and pyrogallol acetone resins such as a phenol formaldehyde resin, m-cresol formaldehyde resin, p-cresol formaldehyde resin, m-/p-mixed cresol formaldehyde resin, or phenol/cresol mixed formaldehyde resin (any of m-, p-, and m-/p-mixed can be adopted) can be presented.

Moreover, as an alkaline water-soluble polymer compound having a phenol hydroxyl group, as further disclosed in the specification of U.S. Pat. No. 4,123,279, a condensation polymer of a phenol and a formaldehyde with an alkyl group having 3 to 8 carbon atoms as a substituent, such as a t-butyl phenol formaldehyde resin or an octyl phenol formaldehyde resin, can be presented.

As a copolymerization method for an alkaline water-soluble polymer compound having a fluorine atom, a conventionally known grafted copolymerization method, plate copolymerization method, random copolymerization method or the like can be adopted.

In the alkaline water-soluble polymer compound having a fluorine atom, the composition weight ratio of the polymerizable monomer having a fluorine atom and other polymerizable monomers (the polymerizable monomer having a fluorine atom: other polymerizable monomers) is preferably from 1:99 to 60:40, and more preferably from 1:99 to 50:50. (i.e. The amount of the polymerizable monomer having a fluorine atom in the polymer compound is preferably from 1 to 60% and more preferably from 1 to 50% by weight of all monomers in the polymer compound.) In a case where the composition weight ratio of the polymerizable monomer having a fluorine atom is small, the polymerizable monomer having a fluorine atom will come out to the surface of the positive-type planographic printing plate material and disturb formation of the outermost part, and thus the effect of improving the developing latitude and the flaw resistance property tends to be small. On the other hand, in a case where the ratio is too large, the image forming property and solubility in the coating liquid tend to be lowered, and thus neither case is preferable.

The weight average molecular weight of the alkaline water-soluble polymer compound having a fluorine atom is preferably 500 or more, and further preferably 1,000 to 700,000. Moreover, the number average molecular weight is preferably 500 or more, and further preferably 750 to 650,000. The degree of dispersion (weight average molecular weight/number average molecular weight) is preferably 1.1 to 10.

The alkaline water-soluble polymer compound having a fluorine atom can be used alone or in a combination of two or more. The total content thereof with respect to total image recording material solid components is preferably 1 to 70% by weight, more preferably 2 to 50% by weight, and particularly preferably 2 to 30% by weight. In a case where the content is less than 1% by weight, the durability tends to be deteriorated. Moreover in a case where it is more than 70% by weight, the sensitivity and the image forming property tend to be lowered, and thus this case is not preferable.

The alkaline water-soluble polymer compound having a fluorine atom can be used together with a conventionally known alkaline water-soluble polymer compound as long as the effect of the present invention is not disturbed. As the conventionally known alkaline water-soluble polymer compound, single polymers of the monomer presented as the polymer component of an alkaline water-soluble polymer compound to which the above-mentioned fluorine-containing unit can be introduced, and copolymers of a combination of a plurality of types thereof can be presented. The conventional alkali-soluble resin content is 0 to 95% by weight, preferably 50 to 95% by weight, and further preferably 70 to 90% by weight with respect to the fluorine-containing alkali-soluble resin according to the present invention.

Below, specific examples of an alkaline water-soluble polymer compound having a fluorine atom ((F-1) to (F-18)) will be presented, but the present invention is not limited thereto. In the specific examples, the weight average molecular weight ($M_w$) and the copolymerization ratio (mole ratio) are shown.

(F-1)
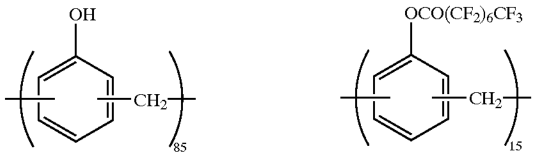
Mw 1.5 x $10^4$ (F-2)
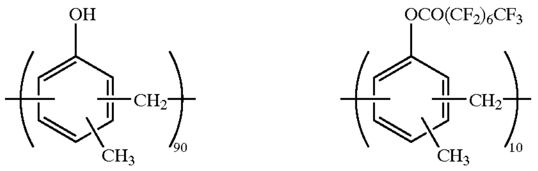
m-cresol/p-cresol ratio = 60/40
Mw x 5.5 $10^3$ (F-3)
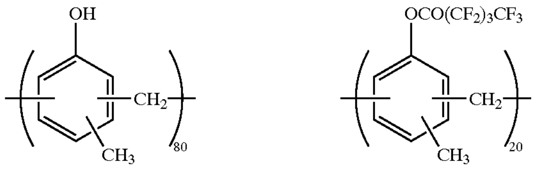
m-cresol/p-cresol ratio = 60/40
Mw 5.3 x $10^3$ (F-4)
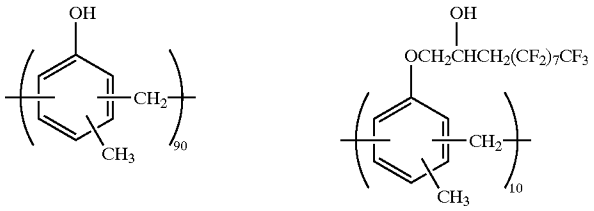
m-cresol/p-cresol ratio = 60/40
Mw 5.5 x $10^3$ (F-5)
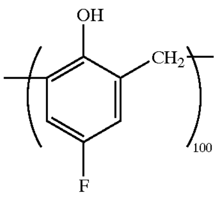
Mw 1.2 x $10^3$ -continued
(F-6)
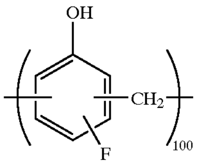
Mw 2.3 × $10^3$
(F-7)
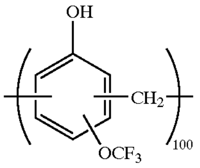
Mw 1.8 × $10^3$
(F-8)
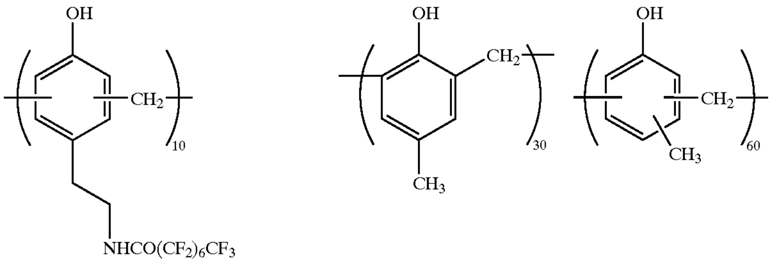
Mw 3.7 × $10^3$
(F-9)
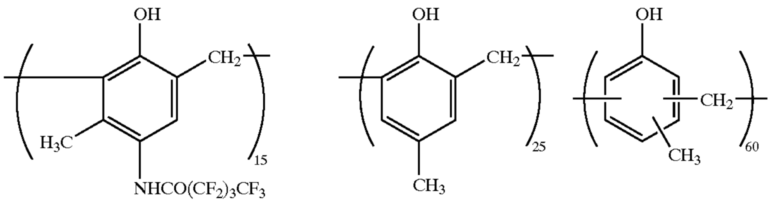
Mw 2.6 × $10^3$
(F-10)
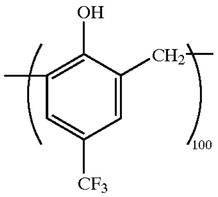
Mw 1.2 × $10^3$
(F-11)
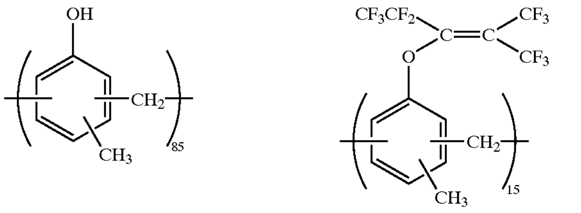
m-cresol/p-cresol ratio = 60/40
Mw 5.5 × $10^3$
(F-12)
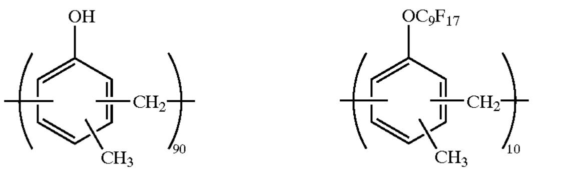
m-cresol/p-cresol ratio = 60/40
Mw 5.6 × $10^3$ -continued
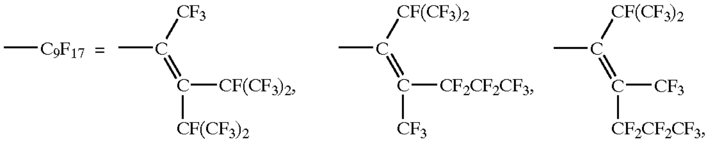
(F-13)
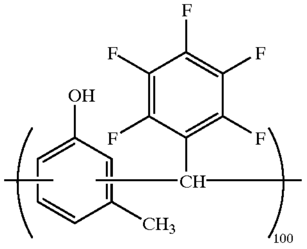
Mw $3.2 \times 10^3$
(F-14)
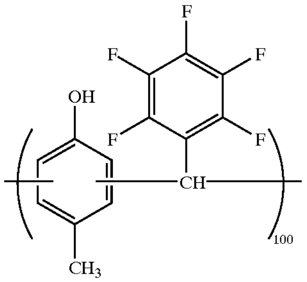
Mw $2.1 \times 10^3$
(F-15)
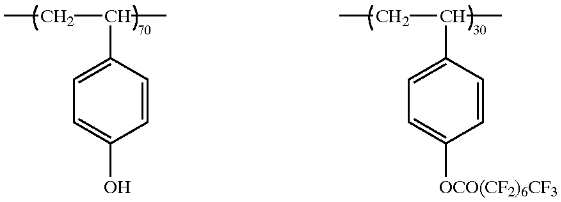
Mw $8.6 \times 10^3$
(F-16)
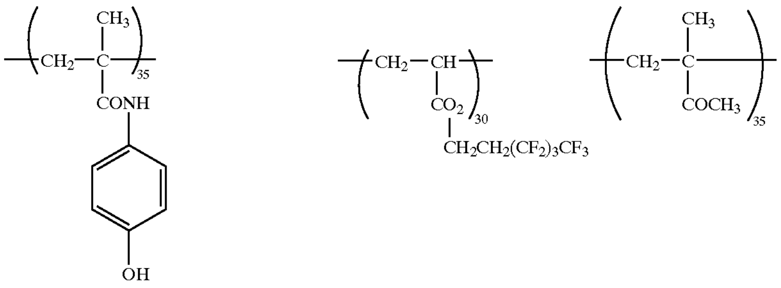
Mw $5.2 \times 10^3$
(F-17)
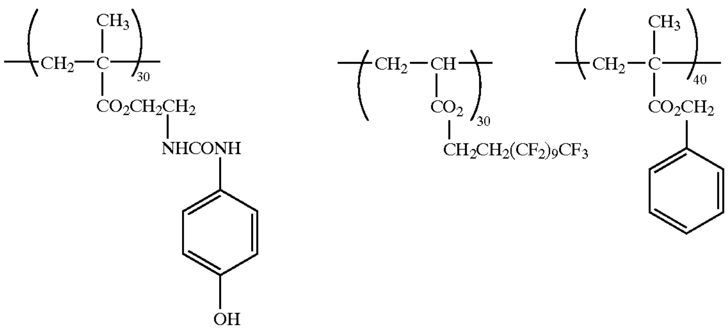

-continued (F-18)

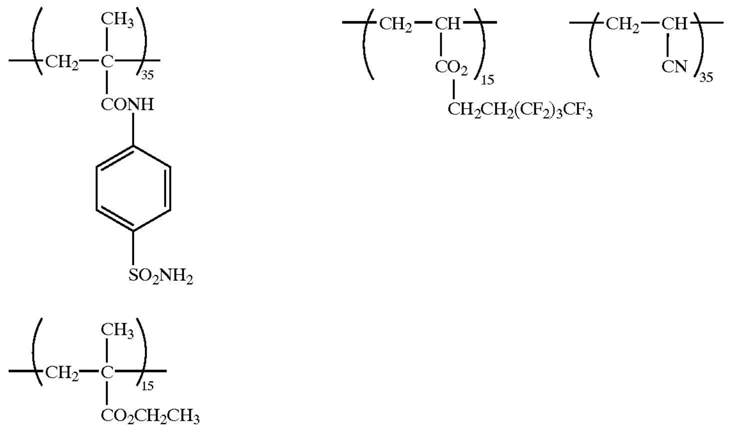

Mw $6.3 \times 10^4$

Infrared Absorbing Agent

The infrared absorbing agent used in the present invention is not particularly limited as long as it is a substance that absorbs infrared rays and generates heat, and thus various pigments or dyes that are known as infrared absorbing dyes or infrared absorbing pigments can be used.

As a pigment, commercially available pigments or those disclosed in color index (C.I.) handbooks, "Latest Pigment Handbook" (edited by Japan Pigment Technology Association, 1977), "Latest Pigment Application technology" (CMC Publishing, 1986), and "Printing Ink Technology" (CMC Publishing, 1984), can be used.

As to kinds of pigment, black pigments, yellow pigments, orange pigments, brown pigments, red pigments, purple pigments, blue pigments, green pigments, fluorescent pigments, metal powder pigments, and polymer bonding pigments can be presented. Specifically, insoluble azo pigments, azo lake pigments, condensed azo pigments, chelate azo pigments, phthalocyanine based pigments, anthraquinone based pigments, perylene and perynone based pigments, thioindigo based pigments, quinacridone based pigments, dioxazine based pigments, isoindolinone based pigments, quinophthalone based pigments, dying lake pigments, azine pigments, nitroso pigments, nitro pigments, natural pigments, fluorescent pigments, inorganic pigments, carbon black, and the like can be used.

These pigments can be used either without surface treatment, or with surface treatment. As a method for surface treatment, a method of surface coating a resin or a wax, a method of adhering a surfactant, a method of bonding a reactive substance (for example, a silane coupling agent, an epoxy compound, a polyisocyanate, or the like) with a pigment surface, and the like can be considered. The above-mentioned surface treatment methods are disclosed in "Nature and Application of Metal Soaps" (Sachi Shobo), "Printing Ink Technology" (CMC Publishing, 1984), and "Latest Pigment Application Technology" (CMC Publishing, 1986).

The pigment particle size is preferably in a range of 0.01 μm to 10 μm, further preferably in a range from 0.05 μm to 1 μm, and particularly preferably in a range from 0.1 μm to 1 μm. A case where the pigment particle size is less than 0.01 μm is not preferable in terms of stability of a dispersion in the photosensitive layer coating liquid. In contrast, a case where the size is more than 10 μm, it is not preferable in terms of homogeneity of the photosensitive layer. As a method for dispersing the pigment, a known dispersion technique used for ink production, toner production, or the like can be used. As a dispersing machine, an ultrasound dispersing device, a sand mill, an attritor, a pearl mill, a super mill, a ball mill, an impeller, a disperser, a KD mill, a colloid mill, a dynatron, a three roll mill, a pressure kneader, or the like can be presented. Details are disclosed in "Latest Pigment Application Technology" (CMC Publishing, 1986).

As the dye, known dyes including commercially available pigments and those disclosed in the literature (such as "Dye Handbook" edited by Organic Synthetic Chemistry Association, 1970) can be used. Specifically, azo dyes, metal complex salt azo dyes, pyrazolone azo dyes, anthraquinone dyes, phthalocyanine dyes, carbonium dyes, quinone imine dyes, methyne dyes, cyanine dyes, and the like can be presented. In the present invention, among these pigments and dyes, those capable of absorbing infrared rays or near-infrared rays are particularly preferable with regard to suitability for use with a laser emitting infrared rays or near-infrared rays.

As a pigment capable of absorbing infrared rays or near-infrared rays, carbon black can be used preferably. Moreover, as a dye capable of absorbing infrared rays or near-infrared rays, for example, cyanine dyes disclosed in JP-A Nos. 58-125246, 59-84356, 59-202829, 60-78787 and the like, methyne dyes disclosed in JP-A Nos. 58-173696, 58-181690, 58-194595 and the like, naphthoquinone dyes disclosed in JP-A Nos. 58-112793, 58-224793, 59-48187, 59-73996, 60-52940, 60-63744 and the like, squarylium dyes disclosed in JP-A No. 58-112792 and the like, cyanine dyes disclosed in British Patent No. 434,875 and the like can be presented.

Moreover, the near-infrared ray absorbing sensitizing agent disclosed in U.S. Pat. No. 5,156,938 can also be preferably used as a dye. Furthermore, the substituted aryl benzo(thio) pyrylium salt in U.S. Pat. No. 3,881,924, the trimethyne thiapyrylium salt disclosed in JP-A No. 57-142645 (U.S. Pat. No. 4,327,169), the pyrylium based compounds disclosed in JP-A Nos. 58-181051, 58-220143, 59-41363, 59-84248, 59-84249, 59-146063, and 59-146061, the cyanine pigment disclosed in JP-A No. 59-216146, the pentamethyne thiopyrylium salt and the like disclosed in U.S. Pat. No. 4,283,475, the pyrylium compounds and the like disclosed in Japanese Patent Application Publication (JP-B) Nos. 5-13514, and 5-19702 and, of commercially available products, EPOLIGHT III-178, EPOLIGHT III- 130, EPOLIGHT III-125 and the like, produced by Epolin Corp., and the like can be used particularly preferably.

Furthermore, as other preferable examples of the dye, the near-infrared ray absorbing dyes of formulae (I) and (II) disclosed in the specification of U.S. Pat. No. 4,756,993 can be presented. These pigments or dyes can be included in a printing plate material at from 0.01 to 50% by weight, and preferably at 0.1 to 10% by weight with respect to the printing plate material total solid components. This ratio is particularly preferably 0.5 to 10% by weight in the case of a dye, and particularly preferably 3.1 to 10% by weight in the case of a pigment. In a case where the amount of the pigment or dye is less than 0.01% by weight, the sensitivity will be lower. In contrast, in a where it is more than 50% by weight, the homogeneity of the photosensitive layer will be lost so that the durability of the recording layer deteriorates. These dyes or pigments can be added to the same layer together with other components, or can be added to another layer to be provided. In the case of providing the other layer, it is preferable to add the dye or pigment to a layer adjacent to a layer containing a substance that is thermally degradable, and to substantially lower the solubility of the binding agent according to the present invention when in an undegraded state. Moreover, it is preferable to add the dye or pigment and the binding resin in the same layer, but they can be provided in different layers.

Other Components

In forming a positive-type recording layer according to the present invention, as needed, various further additives may be added. For example, in terms of improvement of the property of inhibiting dissolution of an image part in a developing solution, it is preferable to use a substance that is thermally degradable and substantially lowers the solubility of the alkaline water-soluble polymer compound in an undegraded state, such as an onium salt, an o-quinonediazide compound, an aromatic sulfonic compound, or an aromatic sulfonic acid ester compound. As the onium salt, a diazonium salt, an ammonium salt, a phosphonium salt, an iodonium salt, a sulfonium salt, a selenonium salt, an arsonium salt, or the like can be presented.

As preferable onium salts used in the present invention, for example, the diazonium salts disclosed in S. I. Schlesinger, *Photogr. Sci. Eng.*, 18, 387 (1974), T. S. Bal et al, *Polymer*, 21, 423 (1980), and JP-A No. 5-158230; the ammonium salts disclosed in U.S. Pat. Nos. 4,069,055 and 4,069,056 and JP-A No. 3-140140; the phosphonium salts disclosed in D. C. Necker et al, *Macromolecules*, 17, 2468 (1984), C. S. Wen et al, *Teh, Proc. Conf. Rad. Curing ASIA*, p478, Tokyo, Oct (1988), and U.S. Pat. Nos. 4,069,055 and 4,069,056; the iodonium salts disclosed in J. V. Crivello et al, *Macromolecules*, 10 (6), 1307 (1977), *Chem. & Eng. News*, Nov. 28, p31 (1988), European Patent No. 104,143, U.S. Pat. Nos. 339,049 and 410,201, and JP-A Nos. 2-150848 and 2-296514; the sulfonium salts disclosed in J. V. Crivello et al, *Polymer J.*, 17, 73 (1985), J. V. Crivello et al. *J. Org. Chem.*, 43, 3055 (1978), W. R. Watt et al, *J. Polymer Sci., Polymer Chem. Ed.*, 22, 1789 (1984), J. V. Crivello et al, *Polymer Bull.*, 14, 279 (1985), J. V. Crivello et al, *Macromolecules* 14 (5), 1141 (1981), J. V. Crivello et al, *J. Polymer Sci., Polymer Chem. Ed.* 17, 2877 (1979), European Patent Nos. 370,693, 233,567, 297,443, and 297, 442, U.S. Pat. Nos. 4,933,377, 3,902,114, 4,760,013, 4,734, 444, 2,833,827, and German Patent Nos. 2,904,626, 3,604, 580, and 3,604,581; the selenonium salts disclosed in J. V. Crivello et al, *Macromolecules*, 10 (6), 1307 (1977), and J. V. Crivello et al, *J. polymer Sci., Polymer Chem. Ed.*, 17, 1047 (1979), the alsonium salts disclosed in C. S. Wen et al, *Teh, Proc. Conf. Rad. Curing ASIA*, p478, Tokyo, Oct (1988; and the like, can be presented.

Among the onium salts, diazonium salts are particularly preferable. Moreover, as particularly preferable diazonium salts, those disclosed in JP-A No. 5-158230 can be presented.

As a counter ion for the onium salt, boron tetrafluoride, phosphoric hexaflouride, triisopropyl naphthalene sulfonic acid, 5-nitro-o-toluene sulfonic acid, 5-sulfosalicylic acid, 2,5-dimethyl benzene sulfonic acid, 2,4,6-trimethyl benzene sulfonic acid, 2-nitro benzene sulfonic acid, 3-chloro benzene sulfonic acid, 3-bromo benzene sulfonic acid, 2-fluoro capryl naphthalene sulfonic acid, dodecyl benzene sulfonic acid, 1-naphthol-5-sulfonic acid, 2-methoxy-4-hydroxy-5-benzoyl-benzene sulfonic acid, paratoluene sulfonic acid, and the like can be presented. Among these examples, alkyl aromatic sulfonic acids such as phosphoric hexafluoride, triisopropyl naphthalene sulfonic acid, and 2,5-dimethyl benzene sulfonic acid are preferable.

As preferable quinonediazides, o-quinonediazide compounds can be presented. An o-quinonediazide compound used in the present invention is a compound having at least one o-quinonediazide group, whose alkaline solubility is increased by thermal decomposition. Therefore, compounds with various structures can be used. That is, the o-quinonediazide facilitates the solubility of the photosensitive materials by both an effect of losing a solubility restraining ability with respect to a binding agent by thermal decomposition, and an effect of the o-quinonediazide itself changing to an alkali-soluble substance. As an o-quinonediazide compound used in the present invention, for example, the compounds disclosed in pages 339 to 352 of "Light-Sensitive Systems" written by J. Kosa (John Wiley & Sons. Inc.) can be used. In particular, sulfonic acid esters or sulfonic amides of an o-quinonediazide, reacted with various kinds of aromatic polyhydroxy compounds or aromatic amino compounds are preferable. Moreover, esters of benzoquinone-(1,2)-diazido sulfonic acid chloride or naphthoquinone-(1,2)-diazido-5-sulfonic acid chloride with pyrogallol-acetone resin, as disclosed in JP-B No. 43-28403, and esters of benzoquinone-(1,2)-diazido sulfonic acid chloride or naphthoquinone-(1,2)-diazido-5-sulfonic acid chloride with a phenol-formaldehyde resin, as disclosed in U.S. Pat. Nos. 3,046,120 and 3,188,210, can be used preferably as well.

Furthermore, esters of naphthoquinone-(1,2)-diazido-4-sulfonic acid chloride with a phenol formaldehyde resin or cresol-formaldehyde resin, and esters of naphthoquinone-(1,2)-diazido-4-sulfonic acid chloride with a pyrogallol-acetone resin can be used preferably as well. Other useful o-quinonediazide compounds are reported in a large number of patents and known. For example, those disclosed in the specifications of JP-A Nos. 47-5303, 48-63802, 48-63803, 48-96575, 49-38701, and 48-13354, JP-B Nos. 41-11222, 45-9610, and 49-17481, U.S. Pat. Nos. 2,797,213, 3,454, 400, 3,544,323, 3,573,917, 3,674,495, and 3,785,825, British Patent Nos. 1,227,602, 1,251,345, 1,267,005, 1,329,888, and 1,330,932, German Patent No. 854,890, and the like can be presented.

The amount of the o-quinonediazide compound is preferably 1 to 50% by weight, more preferably 5 to 30% by weight, and particularly preferably 10 to 30% by weight with respect to printing plate material total solid components. These compounds can be used alone, or can be used in a mixture of a plurality thereof.

The amount of additives other than o-quinonediazide compound is preferably 1 to 50% by weight, more preferably 5 to 30% by weight, and particularly preferably 10 to 30% by weight. It is preferable to have the additives and the binding agent of the present invention in the same layer.

Moreover, in order to further improve the sensitivity, cyclic acid anhydrides, phenols, and organic acids can be used. As the cyclic acid anhydrides, phthalic anhydride, tetrahydro phthalic anhydride, hexahydro phthalic anhydride, 3,6-endoxy-Δ4-tetrahydro phthalic anhydride, tetrachloro phthalic anhydride, maleic anhydride, chlormaleic anhydride, α-phenyl maleic anhydride, succinic anhydride, and a pyromellitic dianhydride disclosed in the specification of U.S. Pat. No. 4,115,128 can be used. As the phenols, bisphenol A, p-nitro phenol, p-ethoxy phenol, 2,4,4'-trihydroxy benzophenone, 2,3,4-trihydroxy benzophenone, 4-hydroxy benzophenone, 4,4',4"-trihydroxy triphenyl methane, 4,4',3",4"-tetrahydroxy-3,5,3',5'-tetra methyl triphenyl methane, and the like can be presented. Furthermore, as organic acids, sulfonic acids, sulfinic acids, alkyl sulfuric acids, phosphonic acids, phosphric esters, carboxylic acids, and the like disclosed in JP-A Nos. 60-88942, 2-96755, and the like can be used. Specifically, p-toluene sulfonic acid, dodecyl benzene sulfonic acid, p-toluene sulfinic acid, ethyl sulfuric acid, phenyl phosphonic acid, phenyl phosphinic acid, phenyl phosphate, diphenyl phosphate, benzoic acid, isophthalic acid, adipic acid, p-toluic acid, 3,4-dimethoxy benzoic acid, phthalic acid, terephthalic acid, 4-cyclohexene-1,2-dicarboxylic acid, erucic acid, lauric acid, n-undecanic acid, ascorbic acid, and the like can be presented. The ratio of the above-mentioned cyclic acid anhydride, phenols, and organic acids in the printing plate material is preferably 0.05 to 20% by weight, more preferably 0.1 to 15% by weight, and particularly preferably 0.1 to 10% by weight.

Moreover, to a recording layer coating liquid according to the present invention, in order to widen process stability with respect to developing conditions, nonionic surfactants as disclosed in JP-A Nos. 62-251740 and 3-208514, amphoteric surfactants as disclosed in JP-A Nos. 59-121044 and 4-13149, siloxane based compounds as disclosed in EP950517, and monomer copolymers containing fluorine as disclosed in JP-A No. 11-288093 can be added.

As specific examples of the nonionic surfactants, sorbitan tristearate, sorbitan monoparmitate, sorbitan triolate, monoglyceride stearate, polyoxy ethylene nonyl phenyl ether, and the like can be presented. As specific examples of the amphoteric surfactants, alkyl di(aminoethyl) glycine, alkyl polyaminoethyl glycine hydrochloride, 2-alkyl-N-carboxyethyl-N-hydroxyethyl imidazolinium betaine, N-tetradecyl-N,N-betaine (for example, product name: "AMOGEN K" produced by Dai Ichi Kogyo Corp.), and the like can be presented.

As the siloxane based compounds, a plate copolymer of a dimethyl siloxane and a polyalkylene oxide is preferable. As specific examples thereof, polyalkylene oxide-modified silicones such as DBE-224, DBE-621, DBE-712, DBP-732 and DBP-534 produced by Chisso Corp., and TEGO GLIDE 100, produced by Tego Corp. of Germany, can be presented.

The ratio of the above-mentioned nonionic surfactants and amphoteric surfactants in the recording layer coating liquid is preferably 0.05 to 15% by weight, more preferably 0.1 to 5% by weight.

In a recording layer according to the present invention, a printout agent for obtaining a visible image immediately after heating for exposure, and a dye or pigment as an image-coloring agent can be added.

As the printout agent, a combination of a compound that discharges an acid when heated for exposure (photo acid discharging agent) and an organic dye capable of forming a salt can be presented as a representative example. Specifically, a combination of an o-naphthoquinonediazide-4-sulfonic acid halogenide and a salt forming-type organic dye disclosed in JP-A Nos. 50-36209 and 53-8128, or a combination of a trihalomethyl compound and a salt forming-type organic dye disclosed in JP-A Nos. 53-36223, 54-74728, 60-3626, 61-143748, 61-151644 and 63-58440 can be presented. The trihalomethyl compounds include oxazol based compounds and triazine based compounds. Both have excellent aging stability and provide a clear printed out image.

As a coloring agent for an image, dyes other than the above-mentioned salt forming-type organic dyes can be used. Including salt forming-type organic dyes, as preferable dyes, oil soluble dyes and basic dyes can be presented. Specifically, oil yellow #101, oil yellow #103, oil pink #312, oil green BG, oil blue BOS, oil blue #603, oil black BY, oil black BS, oil black T-505 (all produced by Orient Kagaku Kogyo Corp.), Victoria pure blue, crystal violet (CI42555), methyl violet (CI42535), ethyl violet, rhodamine B (CI145170B), malachite green (CI42000), methylene blue (CI52015), and the like can be presented. Moreover, the dyes disclosed in JP-A No. 62-293247 are particularly preferable. These dyes can be added in the printing plate material in a ratio of 0.01 to 10% by weight, preferably 0.1 to 3% by weight with respect to the printing plate material total solid components. Furthermore, as needed, a plasticizing agent may be added to the printing plate material according to the present invention for providing coated film flexibility and the like. For example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydro furfuric oleate, oligomers and polymers of acrylic acid or methacrylic acid, and the like can be used.

The recording layer of a planographic printing original plate according to the present invention can be produced by, in general, dissolving the above-mentioned components in a solvent and coating the same onto an appropriate support.

As a solvent used here, ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxy ethane, methyl lactate, N,N-dimethyl acetamide, N,N-dimethyl formamide, tetramethyl urea, N-methyl pyrrolidone, dimethyl sulfoxide, sulforan, γ-butyrolactone, toluene, and the like, can be presented, but the present invention is not limited thereto. These solvents may be used alone or as a mixture.

The concentration of the above-mentioned components (total solid components including the additives) in the solvent is preferably 1 to 50% by weight.

Moreover, a coating amount on the support obtained after coating and drying (solid components) differs depending on the application, but in general 0.5 to 5.0 $g/m^2$ is preferable for a photosensitive printing plate.

As an application method, various methods can be used. For example, bar coater coating, rotation coating, spray coating, curtain coating, dip coating, air knife coating, blade coating, roll coating, and the like can be presented.

With a smaller coating amount, the apparent sensitivity increases, but the film characteristic of the photosensitive film declines. In a photosensitive layer of the present invention, a surfactant for improving the coating property, such as a fluorine based surfactant as disclosed, for example, in JP-A No. 62-170950, can be added. The amount thereof in the recording layer total solid components is preferably 0.01 to 1% by weight, further preferably 0.05 to 0.5% by weight.

The planographic printing original plate of the present invention may have a photosensitive layer with a multi-layer structure. For example, as disclosed in JP-A No. 11-218914, a lower layer containing an alkali-soluble resin can be provided and, the water-insoluble, alkali-soluble resin that contains a fluorine atom can be included in a topmost layer which is a photosensitive layer containing an alkali-soluble resin and an infrared absorbing agent. In such a case, the water-insoluble, alkali-soluble resin that contains a fluorine atom may be included in a lower layer and may be included in an upper layer.

Support

As a support used in the present invention, a plate-like member stable in terms of the size, such as paper, paper with a plastic (for example, polyethylene, polypropylene, polystyrene, or the like) laminated thereon, a metal plate (for example, aluminum, zinc, copper, or the like), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, or the like), paper or a plastic film with one of the above-mentioned metals laminated or deposited thereon, and the like, are included.

As the support of the present invention, a polyester film or an aluminum plate is preferable. Further, an aluminum plate is particularly preferable for dimensional high stability and relatively inexpensive cost. A preferable aluminum plate is a pure aluminum plate or an alloy plate containing aluminum as the main component and slight amounts of different elements. Furthermore, the support may be a plastic film with aluminum laminated or deposited thereon. As different elements contained in an aluminum alloy, silicon, iron, manganese, copper, magnesium, chromium, zinc, bismuth, nickel, titanium, and the like can be presented. The content of the different elements in the alloy is at most 10% by weight. Although a particularly preferable aluminum in the present invention is a pure aluminum, an aluminum containing slight amounts of different elements may be used since it is difficult in terms of refining techniques to produce a completely pure aluminum.

Accordingly, for an aluminum plate adopted in the present invention, the composition thereof is not specified, but aluminum plates of conventionally known and used materials can be used as desired. The thickness of the aluminum plate used in the present invention is about 0.1 mm to 0.6 mm, preferably 0.15 mm to 0.4 mm, and particularly preferably 0.2 mm to 0.3 mm.

Prior to a roughening treatment of an aluminum plate, as desired, a degreasing treatment for eliminating rolling oil on the surface with, for example, a surfactant, organic solvent an alkaline aqueous solution, or the like can be executed. The roughening treatment on the surface of the aluminum plate can be executed by various methods. For example, the operation may be carried out by a mechanical roughening method, a method of dissolving and roughening the surface electro-chemically, a method of selectively dissolving the surface chemically, or the like. As the mechanical method, known methods such as a ball polishing method, a brush polishing method, a blast polishing method, and a buff polishing method can be adopted. Moreover, as an electrochemical roughening method, a method of applying alternative current or direct current in a hydrochloric acid or nitric acid electrolyte can be presented. Moreover, a method combining both the above as disclosed in JP-A No. 54-63902 can be utilized as well. The aluminum plate treated by the roughening treatment as above is, as necessary, treated with an alkali etching treatment and a neutralization treatment, and, as desired, with an anodic oxidation treatment for improving a surface water-retaining property and wear resistance. As an electrolyte used in the anodic oxidation treatment for the aluminum plate, various kinds of electrolytes capable of forming a porous oxide film can be used. In general, sulfuric acid, phosphoric acid, oxalic acid, chromic acid, or an acid mixture thereof can be used. The concentration of these electrolytes can be determined as desired according to the type of the electrolyte.

The anodic oxidation treatment condition cannot be specified for all cases since it varies depending on the type of the electrolyte to be used. But in general, it is appropriate if electrolyte concentration is a 1 to 80% by weight solution, liquid temperature is 5 to 70° C., current density is 5 to 60 $A/dm^2$, voltage is 1 to 100 V, and electrolytic time is in a range of 10 seconds to 5 minutes. In a case where the anodic oxidation film amount is less than 1.0 $g/m^2$, the printing durability may be insufficient, or so-called "flaw pollution", that is, ink adherence to a flaw portion at the time of printing can be generated easily due to ease of flawing in a non-image part of the planographic printing plate. After applying the anodic oxidation treatment, the aluminum surface can be treated with a hydrophilic treatment as needed. As the hydrophilic treatment used in the present invention, an alkaline metal silicate (for example, an aqueous solution of sodium silicate) method as disclosed in U.S. Pat. Nos. 2,714,066, 3,181,461, 3,280,734, and 3,902,734 can be presented. In this method, the support is treated by soaking in an aqueous solution of a sodium silicate or by an electrolytic treatment. In addition thereto, a method of treating with a potassium zirconate fluoride disclosed in JP-B No. 36-22063, a method of treating with a polyvinyl phosphonic acid as disclosed in U.S. Pat. Nos. 3,276,868, 4,153,461, and 4,689,272, and the like can be adopted.

The planographic printing original plate according to the present invention has a positive-type recording layer on a support, and as needed, an undercoat layer may be provided therebetween.

As an undercoat layer component, various kinds of organic compounds can be used. For example, a compound can be selected from carboxymethyl cellulose, dextrin, gum arabic, phosphonic acids having an amino group, such as 2-amino ethyl phosphonic acid; organic phosphonic acids which may have a substituent, such as phenyl phosphonic acid, naphthyl phosphonic acid, alkyl phosphonic acid, glycero phosphonic acid, methylene diphosphonic acid, and ethylene diphosphonic acid; organic phosphoric acids which may have a substituent, such as phenyl phosphoric acid, naphthyl phosphoric acid, alkyl phosphoric acid, and glycero phosphoric acid; organic phosphinic acids which may have a substituent, such as phenyl phosphinic acid, naphthyl phosphinic acid, alkyl phosphinic acid, and glycero phosphinic acid; amino acids, such as glycine and β-alanine; hydrochlorides of amines having a hydroxyl group, such as a hydrochloride of triethanol amine; and the like. These acids may be used in a mixture of two or more.

The organic undercoat layer can be provided by the following methods, that is: a method of coating and drying on an aluminum plate a solution of the above-mentioned organic compound dissolved in water or an organic solvent such as methanol, ethanol or methyl ethyl ketone, or a mixture thereof; and a method of providing an organic undercoat layer by soaking the aluminum plate in a solution prepared by dissolving the above-mentioned organic compound in water, or an organic solvent such as methanol, ethanol, or methyl ethyl ketone, or a mixture thereof, so as to adsorb the above-mentioned compound, followed by washing with water or the like, and drying. In the former method, a 0.005 to 10% by weight concentration solution of the above-mentioned organic compound can be coated by various methods. Moreover, in the latter method, the solution concentration is 0.01 to 20% by weight, preferably 0.05 to 5% by weight, the soaking temperature is 20 to 90° C., preferably 25 to 50° C., and the soaking time is 0.1 second to 20 minutes, preferably 2 seconds to 1 minute. The solution used therefor can be adjusted to within a pH range of 1 to 12 by a basic substance such as ammonia, triethyl amine or potassium hydroxide, or an acidic substance such as hydrochloric acid or phosphoric acid. Moreover, a yellow dye can be added to improve the reproducibility of the tone of the image recording material.

An appropriate coating amount of the organic undercoat layer is 2 to 200 $mg/m^2$, preferably 5 to 100 $mg/m^2$. In a case where the above-mentioned coating amount is less than 2 $mg/m^2$, sufficient printing durability performance will not be obtained. Also, in a case where it is more than 200 $mg/m^2$, the same result is also obtained.

The positive-type planographic printing original plate produced as mentioned above is, in general, treated with image exposure and a developing treatment.

As an active light source used for image exposure, for example, a mercury lamp, a metal halide lamp, a xenon lamp, a chemical lamp, a carbon arc lamp, or the like can be presented. As radiated rays, an electron beam, X-rays, an ion beam, far-infrared rays, and the like can be presented. Moreover, g-ray, i-rays, deep-UV light, or a high density energy beam (laser beam) can be used as well. For a laser beam, a helium-neon laser, an argon laser, a krypton laser, a helium-cadmium laser, a KrF excimer laser, or the like can be presented. In the present invention, a light source having a light emission wavelength in the near-infrared to infrared region is preferable, and a solid laser or semiconductor laser is particularly preferable.

As a developing solution and a replenishing solution for the planographic printing plate of the present invention, conventionally known alkaline aqueous solutions can be used.

For example, inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide can be presented. Moreover, organic alkali agents such as monomethyl amine, dimethyl amine, trimethyl amine, monoethyl amine, diethyl amine, triethyl amine, monoisopropyl amine, diisopropyl amine, triisopropyl amine, n-butyl amine, monoethanol amine, diethanol amine, triethanol amine, monoisopropanol amine, diisopropanol amine, ethylene imine, ethylene diamine, and pyridine can also be used. These alkali agents can be used alone or in a combination of two or more.

Among these alkali agents, particularly preferable developing solutions are an aqueous solution of a silicate such as a sodium silicate or a potassium silicate. This is because the developing property can be adjusted by ratio and concentration of silica oxide $SiO_2$, serving as a component of the silicate, and an alkaline metal oxide $M_2O$. For example, the alkaline metal silicates disclosed in JP-A No. 54-62004 and JP-B No. 57-7427 can be used effectively.

Furthermore, in the case of development using an automatic developing machine, it is known that a large number of planographic printing plates can be processed without the need for replacing a developing solution in a developing tank for a long period of time, by adding an aqueous solution (replenishing solution) with a higher alkaline strength than that of the developing solution to the tank. In the present invention, the replenishing method can be adopted preferably. Various kinds of surfactants and organic solvents can be added to the developing solution and replenishing solution as needed, for promoting or restraining the developing property, and for improving dispersion of developing residue and the ink affinity of a printing plate image part.

As a preferable surfactant, anionic based, cationic based, nonionic based and amphoteric surfactants can be presented. Furthermore, as needed, a reducing agent such as a sodium salt or potassium salt of an inorganic acid, such as hydroquinone, resorcin, sulfurous acid, and hydrogen sulfite; an organic carboxylic acid; an antifoaming agent; and a hard water softening agent may be added to the developing solution and replenishing solution.

The printing plate subjected to the developing process using the above-mentioned developing solution and replenishing solution is post-treated with a washing water, a rinsing solution containing a surfactant or the like and a desensitizing solution containing gum arabic or a starch derivative. As a post-treatment in the case of using an image recording material according to the present invention as a printing plate, these treatments can be used in various combinations.

In the field of plate-making and printing in recent years, for rationalization and standardization of plate-making work, automatic developing machines for printing plates are used widely. An automatic developing machine, in general, has a developing section and a post-treatment section, and includes a device for conveying a printing plate, a vessel for each processing solution, and a spraying device so that a developing treatment can be executed by spraying the each processing solution taken up by a pump from a spray nozzle while horizontally conveying the printing plate after exposure. Moreover, recently, a treatment method of soaking and conveying a printing plate in a processing solution vessel filled with a processing solution by using a submerged guide roll has also become known. In such an automatic treatment, the operation can be executed while replenishing a replenishing solution to each processing solution according to processing amounts, operation time, and the like. Moreover, the so-called nonreturnable treatment method of processing with a substantially unused processing solution can also be adopted.

According to a planographic printing original plate according to the present invention, in a case where there is an unnecessary image part (such as a film edge mark of an original image film) in the planographic printing plate obtained by image exposure, development, washing with water and/or rinsing and/or gum coating, the unnecessary image part can be eliminated. It is preferable to carry out this elimination by a method of applying an erasing solution as disclosed in, for example, JP-B No. 2-13293 on an unnecessary image part, leaving the plate as is for a predetermined time, and washing with water, but it is also possible to use a method of developing after directing an active ray guided by an optical fiber to the unnecessary image part as disclosed in JP-A No. 59-174842.

The planographic printing plate obtained as described above can be provided for a printing process as desired after application of a desensitizing gum. In a case where a planographic printing plate with even higher printing durability strength is desired, a burning treatment can be carried out. In the case of burning a planographic printing plate, it is preferable to process with a baking conditioner as disclosed in JP-B Nos. 61-2518 and 55-28062, and JP-A Nos. 62-31859 and 61-159655 before the burning operation.

As a treatment method, a method of applying the baking conditioner to the planographic printing plate with a sponge or absorbent cotton impregnated with the baking conditioner, a method of applying the same by soaking the printing plate in a vat filled with the baking conditioner, a method of applying the same by an automatic coater, or the like can be adopted. Moreover, by evening out application amounts after application with a squeegee or a squeegee roller, a more preferable result can be provided.

An appropriate baking conditioner application amount is, in general, 0.03 to 0.8 $g/m^2$ (dry weight). The planographic printing plate after the baking conditioner application is, as necessary, dried and heated to a high temperature by using a burning processor (such as the burning processor "BP-1300", which is commercially available from Fuji Photo Film Co., Ltd.). The heating temperature and duration depend on the kinds of components making up the image, but 180 to 300° C. for 1 to 20 minutes is preferable.

The planographic printing plate after the burning treatment can optionally undergo conventionally executed treatments such as washing with water and gum coating, but in cases where a baking conditioner containing a water soluble polymer compound or the like is used, the so-called desensitizing treatment such as gum coating can be omitted. The planographic printing plate obtained by these treatments is provided to an offset printing machine or the like and used for printing a large number of sheets.

EXAMPLES

Hereinafter, the present invention will be explained with reference to Examples, but the scope of the present invention is not limited thereto.

Synthesis of a Fluorine-containing Alkali-soluble Resin

Synthesis Example 1: Synthesis of Fluorine-containing Alkali-soluble Resin (F-2)

120 g of cresol novolak (m/p=60/40, Mw=5.2×$10^3$) was dissolved in 400 ml of acetone. 10.1 g of triethyl amine was added thereto, and this solution was agitated for 10 minutes. Then, 43.3 g of perfluorooctanoyl chloride was dropped therein gradually while cooling with water, and the solution was agitated for 4 hours at room temperature. The reaction solution was poured into 8,000 ml of water. By filtrating a precipitate, washing with water, and drying, 145 g of a fluorine-containing alkali-soluble resin (F-2) was obtained.

Synthesis Example 2: Synthesis of Fluorine-containing Alkali-soluble Resin (F-4)

120 g of cresol novolak (m/p=60/40, Mw=5.2×$10^3$) was dissolved in 400 ml of methanol. 5.4 g of sodium methoxide was added thereto, and this solution was agitated for 30 minutes. The methanol was eliminated under a reduced pressure. 400 ml of tetrahydrofuran was added to the solution to substitute for the solvent. 47.6 g of 3-(perfluoro-n-octyl)-1,2-propene oxide was added thereto, and the solution was heated to reflux for 6 hours. The reaction solution was cooled down to room temperature, and poured into 8,000 ml of water. By filtrating the separated substance, washing with water, and drying, 162 g of a fluorine-containing alkali-soluble resin (F-4) was obtained.

Synthesis Example 3: Synthesis of Fluorine-containing Alkali-soluble Resin (F-7)

a mixture of 24.6 g of 3-trifluoromethoxy phenol, 8 ml of water, 8.9 g of a 37% aqueous solution of formalin, and 200 mg of oxalic acid was heated to reflux for 8 hours. After this reaction, a volatile composition was eliminated under a reduced pressure. The remainder was dissolved in 200 ml of methanol, and poured into 3,000 ml of water. By filtrating a separated substance, washing with water, and drying, 25.1 g of a fluorine-containing alkali-soluble resin (F-7) was obtained.

Synthesis Example 4: Synthesis of Fluorine-containing Alkali-soluble Resin (F-11)

120 g of cresol novolak (m/p=60/40, Mw=5.2×$10^3$) and 30.0 g of hexafluoropropene dimer were mixed with 150 ml of dimethyl formamide. While cooling with water, 10.1 g of triethyl amine was added slowly, and this mixture was agitated for 5 hours at room temperature. The reaction solution was poured into 500 ml of dilute hydrochloric acid. By filtrating a separated substance, washing with water, and drying, 135 g of a fluorine-containing alkali-soluble resin (F-11) was obtained.

Synthesis Example 5: Synthesis of Fluorine-containing Alkali-soluble Resin (F-13)

A mixture of 27.5 g of m-cresol, 50.0 g of pentafluorobenzaldehyde, and 1.1 g of a p-toluene sulfonic acid monohydrate was heated to 90° C. and agitated for 5 hours. After this reaction, a volatile component was eliminated under a reduced pressure. The remainder was dissolved in 250 ml of methanol, and poured into 4,000 ml of water. By filtrating a separated substance, washing with water, and drying, 65.2 g of a fluorine-containing alkali-soluble resin (F-13) was obtained.

Synthesis Example 6: Synthesis of Fluorine-containing Alkali-soluble Resin (F-18)

31.0 g of methacrylic acid, 39.1 g of chloroethyl formate, and 200 ml of acetonitrile were put in an ice water bath, and this mixture was agitated while cooling. 36.4 g of triethylamine was dropped into the mixture by a dropping funnel over about 1 hour. After the dropping was finished, the ice water bath was taken away, the mixture was agitated for 30 minutes at room temperature. 51.7 g of p-amino benzene sulfonamide was added to the reaction mixture, and the mixture was agitated for 1 hour while being heated at 70° C. After finishing the reaction, an obtained mixture was introduced into 1,000 ml of water while agitating the water, and the obtained mixture was agitated for 30 minutes. The mixture was filtrated for taking out a precipitate. After adding 500 ml of water to the precipitate to make a slurry, the slurry was filtrated, and an obtained solid was dried so as to obtain N-(p-aminosulfonyl phenyl) methacrylamide (yield 46.9 g).

5.04 g of the N-(p-aminosulfonyl phenyl) methacrylamide, 1.03 g of ethyl methacrylate, 1.11 g of acrylonitrile, 2.86 g of 1H, 1H,2H,2H-perfluorohexyl acrylate, and 20 g of N,N-dimethyl acetamide were introduced, and this mixture was agitated while being heated at 65° C. As a radical polymerization initiator, 0.15 g of 2,2'-azo bis (2,4-dimethyl valeronitrile) (product name: V-65, produced by Wako Junyaku Corp.) was added to the mixture, and the mixture was agitated under a nitrogen air flow for 2 hours while being kept at 65° C. To the reaction mixture, furthermore, a mixture of 5.04 g of the N-(p-aminosulfonyl phenyl) methacrylamide, 1.03 g of ethyl methacrylate, 1.11 g of acrylonitrile, 2.86 g of 1H,1H,2H,2H-perfluoro hexyl acrylate, 20 g of N,N-dimethyl acetamide and 0.15 g of V-65 was dropped over 2 hours by a dropping funnel. After finishing the dropping operation, the obtained mixture was agitated for a further 2 hours at 65° C. After finishing this reaction, 40 g of methanol was added to the mixture, and cooled. The obtained mixture was introduced into 2,000 ml of water while agitating the water. After agitating the mixture for 30 minutes, a precipitate was taken out by filtration and dried so as to obtain 19 g of a fluorine-containing alkali-soluble resin (F-18).

The weight average molecular weight ($M_w$) of the above-mentioned fluorine-containing alkali-soluble resin was measured by gel permeation chromatography (polystyrene standard).

Production of a Substrate

A 0.3 mm thickness aluminum plate (material 1050) was washed with trichloroethylene for degreasing. The surface of the aluminum plate was grained using a nylon brush and a 400 mesh pumice-water suspension, and washed well with water. The plate was soaked in a 25% aqueous solution of sodium hydroxide at 45° C. for 9 seconds for etching. After washing with water, the plate was further soaked in 20% nitric acid for 20 seconds, and washed with water. An etched amount of the grained surface was about 3 g/$m^2$. Next, the plate was provided with a 3 g/$m^2$ direct current anodic oxidation film by a current density of 15 A/$dm^2$ in a 7% sulfuric acid electrolyte, washed with water, and dried. Furthermore, the plate was treated with a 2.5% by weight aqueous solution of sodium silicate at 30° C. for 10 seconds. A below-described undercoat solution was applied thereto, and this coated film was dried at 80° C. for 15 seconds so as to obtain the substrate. The coating film amount after drying was 15 mg/$m^2$.

| [Undercoat solution] | |
|---|---|
| compound described below | 0.3 g |
| methanol | 100 g |
| water | 1 g |

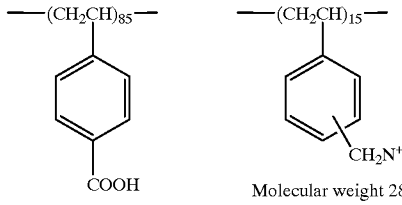

Molecular weight 28,000

Example 1

After application of a below-described photosensitive solution 1 to the obtained substrate so as to have a 1.0 g/$m^2$ coating amount, the coating was dried at 140° C. for 50 seconds in a PERFECT OVEN PH200, produced by Tabai Corp., with a wind control set at 7, so as to obtain a planographic printing original plate 1.

| [Photosensitive Solution 1] | |
|---|---|
| m,p-cresol novolak (m/p ratio = 6/4, weight average molecular weight 3,500, unreacted cresol contained at 0.5% by weight) | 0.427 g |
| Fluorine-containing alkali-soluble resin (F-2) | 0.047 g |
| Specific copolymer 1 disclosed in JP-A No. 11-288093 | 2.37 g |
| Cyanine dye A (structure described below) | 0.155 g |
| 2-methoxy-4-(N-phenyl amino) benzene diazoniumhexafluorophosphate | 0.03 g |
| Tetrahydrophthalic anhydride | 0.19 g |
| Ethyl violet with 6-hydroxy-β-naphthalene sulfonic acid as a counter ion | 0.05 g |
| Fluorine based surfactant (MEGAFAC F176PF, produced by Dai Nippon Ink & Chemicals, Inc.) | 0.035 g |
| Fluorine based surfactant (MEGAFAC MCF-312, produced by Dai Nippon Ink & Chemicals, Inc.) | 0.05 g |
| Paratoluene sulfonic acid | 0.008 g |
| Bis-p-hydroxyphenyl sulfone | 0.063 g |
| Stearic acid n-dodecyl | 0.06 g |
| γ-butyrolactone | 13 g |
| Methyl ethyl ketone | 24 g |
| 1-methoxy-2-propanol | 11 g |

Cyanine dye A

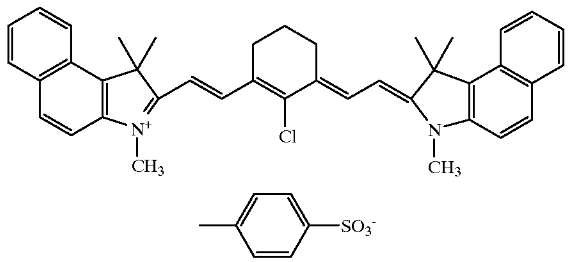

Example 2

After application of a below-described photosensitive solution 2 to the obtained substrate so as to have a 1.6 g/$m^2$ coating amount, the coating was dried in the same conditions as in Example 1 so as to obtain a planographic printing original plate 2.

| [Photosensitive Solution 2] | |
|---|---|
| m,p-cresol novolak (m/p ratio = 6/4, weight average molecular weight 5,000, unreacted cresol contained at 0.5% by weight) | 2.00 g |
| Fluorine-containing alkali-soluble resin (F-2) | 0.25 g |
| Octyl phenol novolak (weight average molecular weight: 2,500) | 0.015 g |
| Cyanine dye A | 0.105 g |
| 2-methoxy-4-(N-phenyl amino) benzene diazonium-hexafluoro phosphate | 0.03 g |
| Tetrahydrophthalic anhydride | 0.10 g |
| Ethyl violet with 6-hydroxy-β-naphthalene sulfonic acid as the counter ion | 0.063 g |
| Fluorine based surfactant (MEGAFAC F176PF, produced by Dai Nippon Ink & Chemicals, Inc.) | 0.035 g |
| Fluorine based surfactant (MEGAFAC MCF-312, produced by Dai Nippon Ink & Chemicals, Inc.) | 0.13 g |
| Bis-p-hydroxy phenyl sulfone | 0.08 g |
| Methyl ethyl ketone | 16 g |
| 1-methoxy-2-propanol | 10 g |

Examples 3 to 7

By the same process as in Example 1, except that the fluorine-containing alkali-soluble resins shown in table 1 below were used as the fluorine-containing alkali-soluble resin instead of (F-2) in the photosensitive solution 1 of Example 1, planographic printing original plates 3 to 7 were obtained.

TABLE 1

| | | Fluorine-containing alkali-soluble resin |
|---|---|---|
| Example 3 | Planographic printing original plate 3 | F-4 |
| Example 4 | Planographic printing original plate 4 | F-7 |
| Example 5 | Planographic printing original plate 5 | F-11 |
| Example 6 | Planographic printing original plate 6 | F-13 |
| Example 7 | Planographic printing original plate 7 | F-18 |

Example 8

After application of a photosensitive solution 3 to the obtained substrate so as to have a 0.7 g/$m^2$ coating amount, the coating was dried at 140° C. for 50 seconds. Then, a photosensitive solution 4 was applied so as to have a 0.3 g/$m^2$ coating amount and this coating was dried at 120° C. for 60 seconds, so as to obtain a planographic printing original plate 8.

| [Photosensitive solution 3] | |
|---|---|
| N-(4-aminosulfonyl phenyl) methacrylamide/acrilonitrile/ methyl methacrylate (36/34/30, weight average molecular weight 50,000, acid value 2.65) | 2.133 g |
| Cyanine dye A | 0.109 g |
| 4,4'-bis hydroxyphenyl sulfone | 0.126 g |
| Tetrahydrophthalic anhydride | 0.190 g |
| p-toluene sulfonic acid | 0.008 g |
| 3-methoxy-4-diazodiphenyl amine hexafluorophosphate | 0.03 g |
| Ethyl violet with 6-hydroxy naphthalene sulfonic acid as a counter ion | 0.100 g |
| MEGAFAC F176 (produced by Dai Nippon Ink & Chemicals, Inc.; fluorine based surfactant for improving coating surface) | 0.035 g |
| Methyl ethyl ketone | 30.82 g |
| 1-methoxy-2-propanol | 15.74 g |
| γ-butyrolactone | 16.00 g |

| [Photosensitive solution 4] | |
|---|---|
| Fluorine-containing alkali-soluble resin (F-4) | 0.348 g |
| Cyanine dye A | 0.019 g |
| MEGAFAC F176 (20%) (produced by Dai Nippon Ink & Chemicals, Inc.; surfactant for improving coating surface) | 0.022 g |
| Methyl ethyl ketone | 13.07 g |
| 1-methoxy-2-propanol | 6.79 g |

Comparative Example 1

A planographic printing original plate 9 was obtained by the same process as in Example 1, except that 0.474 g of m,p-cresol novolak (m/p ratio=6/4, weight average molecular weight 3,500, unreacted cresol contained at 0.5% by weight) was used instead of the fluorine-containing alkali-soluble resin (F-2) used in the photosensitive solution 1 of Example 1.

Comparative Example 2

A planographic printing original plate 10 was obtained by the same process as in Example 2 except that 2.25 g of the m,p-cresol novolak (m/p ratio=6/4, weight average molecular weight 3,500, unreacted cresol contained at 0.5% by weight) was used instead of the fluorine-containing alkali-soluble resin (F-2) used in the photosensitive solution 2 of Example 2.

Comparative Example 3

A planographic printing original plate 11 was obtained by the same process as in Example 8 except that 0.348 g of the m,p-cresol novolak (m/p ratio=6/4, weight average molecular weight 3,500, unreacted cresol contained at 0.5% by weight) was used instead of the fluorine-containing alkali-soluble resin (F-4) used in the photosensitive solution 4 of Example 8.

Evaluation of Planographic Printing Original Plates

Flaw Resistance Test

The obtained planographic printing original plates 1 to 8 according to the present invention and planographic printing original plates 9 to 11 of the Comparative Examples were abraded by 30 turns with an abraser felt CS5 under a 250 g load, using a ROTARY ABRASION TESTER (produced by Toyo Seiki Corp.).

Thereafter, each block was developed, with a 30° C. liquid temperature and a 12 second developing time, using a PS PROCESSOR 900H, produced by Fuji Photo Film Co., Ltd., containing a developing solution DT-1 (diluted 1:8), produced by Fuji Photo Film Co., Ltd., and a finisher FP2W (diluted 1:1), produced by Fuji Photo Film Co., Ltd. The conductivity of the developing solution at the time was 45 mS/cm.

The flaw resistance was evaluated according to the following standards.

○: Optical density of an abraded portion of the photosensitive film was not changed at all Δ: A slight change of optical density of the abraded portion of the photosensitive film was visually observed X: The optical density of the abraded portion of the photosensitive film was ⅔ or less relative to a non-abraded portion Results of the flaw resistance evaluation are shown in table 2.

TABLE 2

| | | Flaw resistance evaluation |
|---|---|---|
| Example 1 | Planographic printing original plate 1 | ○ |
| Example 2 | Planographic printing original plate 2 | ○ |
| Example 3 | Planographic printing original plate 3 | ○ |
| Example 4 | Planographic printing original plate 4 | ○ |
| Example 5 | Planographic printing original plate 5 | ○ |
| Example 6 | Planographic printing original plate 6 | ○ |
| Example 7 | Planographic printing original plate 7 | ○ |
| Example 8 | Planographic printing original plate 8 | ○ |
| Comparative Example 1 | Planographic printing original plate 9 | Δ |
| Comparative Example 2 | Planographic printing original plate 10 | × |
| Comparative Example 3 | Planographic printing original plate 11 | Δ |

As is apparent from table 2, compared with the Comparative Examples 1 to 3 not containing a fluorine-containing alkali-soluble resin, the planographic printing plates according to the present invention showed better flaw resistance.

Evaluation of Developing Latitude

A test pattern image was written on the obtained planographic printing original plates 1 to 8 according to the present invention and planographic printing original plates 9 to 11 of the Comparative Examples by a TRENDSETTER, produced by Creo Corp., with a 9 W beam strength, and a 150 rpm drum rotation speed.

First, the planographic printing original plates 1 to 11 exposed in the above-mentioned conditions were developed, with a 30° C. liquid temperature and a 12 second developing time, using a PS PROCESSOR 900H, produced by Fuji Photo Film Co., Ltd., containing developing solution DT-1 (diluted 1:9 and 1:10), produced by Fuji Photo Film Co., Ltd., and finisher FP2W (diluted 1:1), produced by Fuji Photo Film Co., Ltd. The conductivity of the developing solutions at the time were 41 mS/cm and 39 mS/cm, respectively.

Whether or not pollution or coloring derived from a recording layer residue film due to developing failure were present on the exposed part (non-image part) after development was observed visually. In the cases of developing with the developing solution DT-1 diluted 1:9, pollution of the non-image part was not observed in any of the planographic printing plates, and a good developing property was provided. However, in the cases of developing with DT-1 diluted 1:10, pollution was observed in the non-image part in all of the planographic printing plates. From this fact, it was confirmed that the planographic printing original plates 1 to 11 are at about the same level with regard to the developing property of exposed parts.

Next, the planographic printing original plates 1 to 11 exposed in the above-mentioned conditions were developed, while keeping a 30° C. liquid temperature, by a 12 second developing time using a PS PROCESSOR 900H, produced by Fuji Photo Film Co., Ltd., containing developing solution DT-1 (diluted 1:6.5), produced by Fuji Photo Film Co., Ltd., and finisher FP2W (diluted by 1:1), produced by Fuji Photo Film Co., Ltd. The conductivity of the developing solution at the time was 52 mS/cm.

Then, the optical densities of the photosensitive layer unexposed parts (image parts) of the obtained planographic printing plates after development were evaluated by visual inspection. Plates without deterioration of the optical density compared with the corresponding plate developed with the above-mentioned developing solution with DT-1 diluted 1:9 were evaluated as ○, plates with a slight optical density deterioration were evaluated as Δ, and plates with an optical density deterioration were evaluated as X. Results are shown in table 3.

It is shown that plates without a density deterioration did not exhibit elution of image parts with respect to a developing solution with a higher activity, and thus these plates have a wide latitude with respect to developing solution activity.

TABLE 3

| | | Optical density deterioration |
|---|---|---|
| Example 1 | Planographic printing original plate 1 | ○ |
| Example 2 | Planographic printing original plate 2 | ○ |
| Example 3 | Planographic printing original plate 3 | ○ |
| Example 4 | Planographic printing original plate 4 | ○ |
| Example 5 | Planographic printing original plate 5 | ○ |
| Example 6 | Planographic printing original plate 6 | ○ |
| Example 7 | Planographic printing original plate 7 | ○ |
| Example 8 | Planographic printing original plate 8 | ○ |
| Comparative Example 1 | Planographic printing original plate 9 | × |
| Comparative Example 2 | Planographic printing original plate 10 | × |
| Comparative Example 3 | Planographic printing original plate 11 | Δ |

As is apparent from table 3, the planographic printing original plates according to the present invention had a good developing latitude with a good developing property and were free of generation of a residue film in the non-image parts and of density deterioration in the image parts.

According to the present invention, a positive-type planographic printing original plate for infrared lasers for direct plate-making, having excellent latitude at a time of forming an image by development and excellent flaw resistance can be provided.

What is claimed is:

1. A positive-type planographic printing original plate comprising:

a support; and on the support, a positive-type recording layer comprising an infrared absorbing agent and a water-insoluble, alkali-soluble resin which has a fluorine atom in a molecule thereof, wherein solubility of the positive-type recording layer is increased relative to an alkaline aqueous solution after infrared laser exposure; and the water-insoluble, alkali-soluble resin having a fluorine atom in the molecule comprises a novolak compound.

2. A planographic printing original plate comprising:

a support; and on the support, a positive-type recording layer comprising an infrared absorbing agent and a water-insoluble, alkali-soluble resin which has a fluorine atom in a molecule thereof, wherein solubility of the positive-type recording layer is increased relative to an alkaline aqueous solution after infrared laser exposure and wherein the positive-type recording layer includes a lower layer and an upper layer, the upper layer comprising the infrared absorbing agent and the water-insoluble, alkali-soluble resin which has a fluorine atom in a molecule thereof, and the lower layer comprising said water-insoluble, alkali-soluble resin or another water-insoluble, alkali-soluble resin.

3. A planographic printing original plate according to claim 2, wherein the water-insoluble, alkali-soluble resin having a fluorine atom in the molecule comprises a polymer compound including a functional group selected from the group consisting of a phenol hydroxyl group, a sulfonamide group, and an active imide group.

4. A planographic printing original plate according to claim 2, wherein the water-insoluble, alkali-soluble resin having a fluorine atom in the molecule comprises a polymer compound comprising a phenol hydroxyl group.

5. A planographic printing original plate according to claim 2, wherein the water-insoluble, alkali-soluble resin having a fluorine atom in the molecule comprises, as copolymer components: a polymerizable monomer comprising a low molecular compound having, in a molecule, at least one substituent having a fluorine atom and at least one polymerizable unsaturated bond; and at least one monomer selected from the group consisting of a polymerizable monomer having a phenol hydroxyl group, a polymerizable monomer having a sulfonamide group, and a polymerizable monomer having an active imide group.

6. A planographic printing original plate according to claim 5, wherein the substituent having a fluorine atom is a substituent selected from the group consisting of a fluorine atom, a trifluoromethyl group, a pentafluoroethyl group, a heptafluoropropyl group, a perfluoro alkyl group, a fluorine-substituted aryl group, and a perfluoro alkenyl group.

7. A planographic printing original plate according to claim 5, wherein an amount of the polymerizable monomer comprising the low molecular compound in the water-insoluble, alkali-soluble resin having a fluorine atom in the molecule is from 1 to 60% by weight of all monomers therein.

8. A planographic printing original plate according to claim 5, wherein the polymerizable monomer having a phenol hydroxyl group is a monomer selected from the group consisting of an acrylamide having a phenol hydroxyl group, a methacrylamide having a phenol hydroxyl group, an ester acrylate having a phenol hydroxyl group, a methacrylic acid ester having a phenol hydroxyl group, and a hydroxystyrene having a phenol hydroxyl group.

9. A planographic printing original plate according to claim 5, wherein the polymerizable monomer having a sulfonamide group is a compound comprising at least one selected from the group consisting of an acryloyl group, an allyl group, and a vinyloxy group, and at least one of a substituted amino sulfonyl group and a substituted sulfonyl imino group.

10. A planographic printing original plate according to claim 5, wherein the polymerizable monomer having an active imide group comprises at least one of N-(p-toluene sulfonyl) methacrylamide, and N-(p-toluene sulfonyl) acrylamide.

11. A planographic printing original plate according to claim 2, wherein the water-insoluble, alkali-soluble resin having a fluorine atom in the molecule comprises a pyrogallol-acetone resin.

12. A planographic printing original plate according to claim 2, wherein the water-insoluble, alkali-soluble resin having a fluorine atom in the molecule comprises a condensation polymer of a phenol having an alkyl group of 3 to 8 carbon atoms and formaldehyde.

13. A planographic printing original plate according to claim 2, wherein degree of dispersion of the water-insoluble, alkali-soluble resin having a fluorine atom in the molecule is from 1.1 to 10.

14. A planographic printing original plate according to claim 2, wherein the water-insoluble, alkali-soluble resin having a fluorine atom in the molecule comprises a novolak compound.

* * * * *